United States Patent [19]
Akabane

[11] Patent Number: 5,266,904
[45] Date of Patent: * Nov. 30, 1993

[54] PRINTED CIRCUIT BOARD WITH THROUGH-HOLES INCLUDING A TEST LAND HAVING TWO CURRENT MEASURING LANDS AND TWO RESISTANCE MEASURING LANDS

[75] Inventor: Masao Akabane, Saitama, Japan

[73] Assignee: Nippon CMK Corp., Japan

[*] Notice: The portion of the term of this patent subsequent to Mar. 30, 2000 has been disclaimed.

[21] Appl. No.: 682,915

[22] Filed: Apr. 9, 1991

[30] Foreign Application Priority Data

Apr. 16, 1990 [JP] Japan .................................. 2-99858

[51] Int. Cl.⁵ ...................... G01R 27/08; G01R 31/02
[52] U.S. Cl. ................................ 324/715; 324/158 R; 324/537; 324/713
[58] Field of Search ............... 324/713, 715, 716, 718, 324/719, 725, 537, 158 R, 158 P, 158 F

[56] References Cited

U.S. PATENT DOCUMENTS

| | | | |
|---|---|---|---|
| 3,766,470 | 10/1973 | Hay et al. | 324/715 X |
| 3,781,683 | 12/1973 | Freed | 324/158 F |
| 4,245,189 | 1/1981 | Wahl et al. | 324/716 |
| 4,675,600 | 6/1987 | Gergin | 324/158 F X |

Primary Examiner—Gerard R. Strecker
Assistant Examiner—Diep Do
Attorney, Agent, or Firm—Bruce L. Adams; Van C. Wilks

[57] ABSTRACT

A printed circuit board having through-holes and a test land for testing the through-holes. The test land is composed of a pair of current measurement lands and a pair of resistance measurement lands in order to test accurately the packing conditions of the conductive paste packed in the through-holes, thereby improving the uniformity and completeness of conductive-paste packing in printed circuit boards.

5 Claims, 2 Drawing Sheets

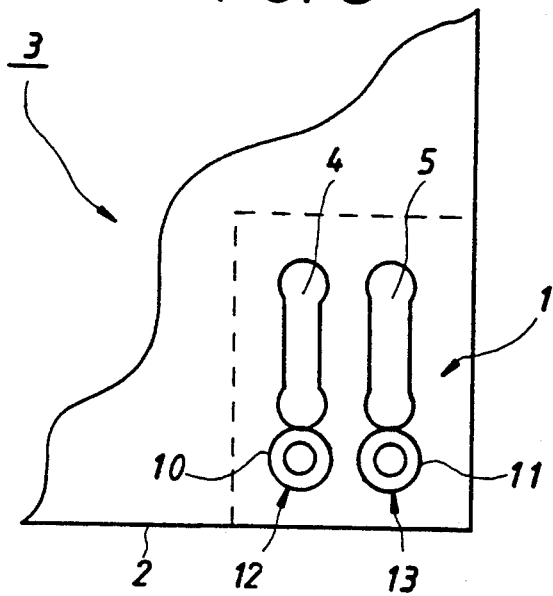
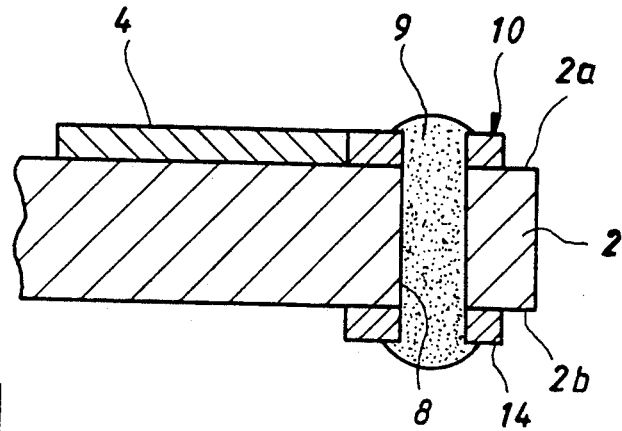
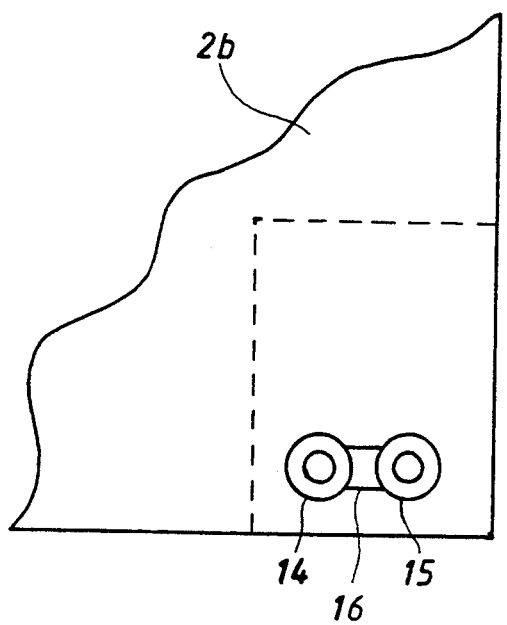

PRINTED CIRCUIT BOARD WITH THROUGH-HOLES INCLUDING A TEST LAND HAVING TWO CURRENT MEASURING LANDS AND TWO RESISTANCE MEASURING LANDS

BACKGROUND OF THE INVENTION

The present invention relates to a printed circuit board with through-holes. In the manufacture of conventional printed circuit boards with through-holes, after the through-holes are bored in the required positions, it is normal practice to pack conductive paste into the through-holes using a silk-screen printing method. In such cases, it is difficult for screen printing to spread conductive paste uniformly among all the through-holes on the printed circuit board or even in one of them, and the problem of incomplete packing thus arises. Unfortunately, no effective means exists to test the electrical properties of the packed conductive paste. Such a testing method would thus be desirable for printed circuit boards.

SUMMARY OF THE INVENTION

An object of the present invention is both to provide a printed circuit board with through-holes filled with conductive paste and a means to test these through-holes.

According to the present invention, a printed circuit board is provided with through-holes filled with conductive paste between the two sides of the printed circuit board. A test land, for testing the through-holes, is provided composed of a pair of current measurement lands and a pair of resistance measurement lands.

According to the above construction of the printed circuit board with through-holes, the packing conditions of conductive paste packed in the through-holes can be accurately tested, thereby improving the uniformity and completeness of conductive-paste packing among printed circuit boards. It is also possible to measure precisely the electrical properties of packed conductive paste in an individual printed circuit board by using the four-probe method, thus improving test accuracy.

Other objects, features, aspects, and advantages of the present invention will become more apparent from the following detailed description of the present invention and its accompanying drawings.

BRIEF DESCRIPTION OF THE DRAWINGS

FIG. 3 is a top plan view showing a test land of a printed circuit board having through-holes as the second embodiment of the present invention;

FIG. 4 is a longitudinal sectional view showing the test land in the second embodiment; and FIG. 5 is a bottom plan view showing the test land in the second embodiment.

DETAILED DESCRIPTION OF THE INVENTION

First Embodiment

Figure 1:
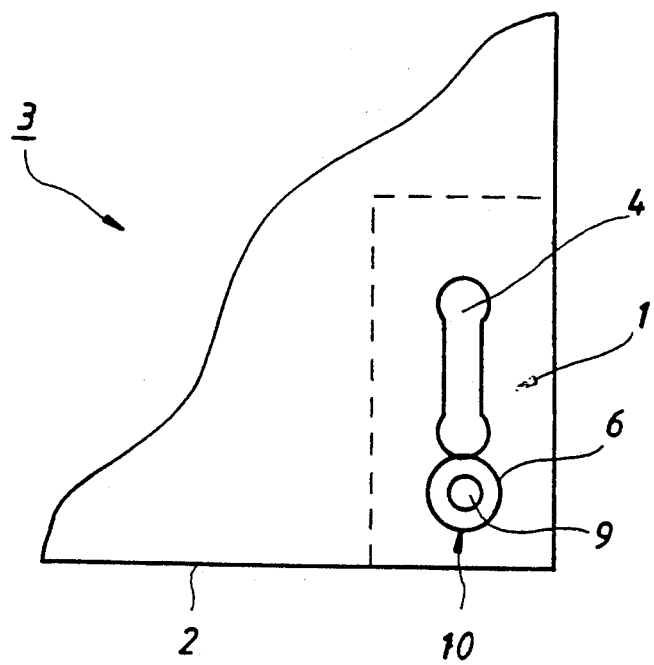
FIG. 1 is a top plan view showing a test land of a printed circuit board having through-holes as the first embodiment of the present invention.
Figure 2:
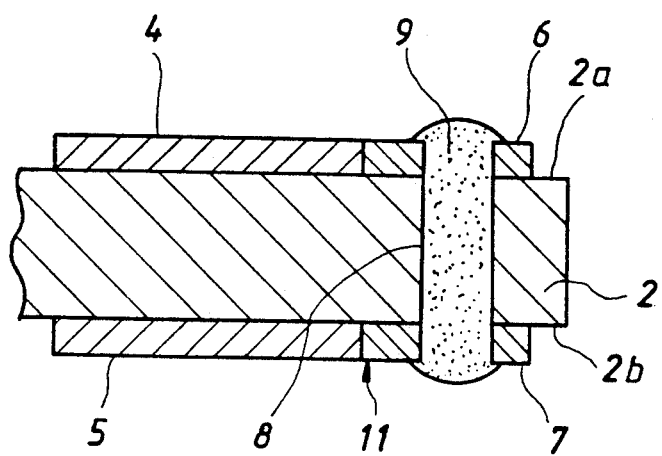
FIG. 2 is a longitudinal sectional view showing the test land in the first embodiment.

FIG. 1 is a top plan view showing a test land of a printed circuit board having through-holes as the first embodiment of the present invention. FIG. 2 is a longitudinal sectional view showing the test land.

Referring to FIG. 1, the reference numeral 1 indicates a test land disposed in the required position on a printed circuit board (3) composed of a substrate (2) comprising the required circuit patterns (not shown) and through-holes (not shown).

Although FIG. 1 gives no concrete indication of the required position of the test land (1), the printed circuit board (3) may be constructed such that the test land (1) is removable from the circuit board as a product after the through-holes have been tested.

The test land (1), consisting of current measurement lands (4 and 5) and resistance measurement lands (10 and 11), is provided in the process of providing pattern circuits during the manufacture of the printed circuit board (3). After forming the current measurement lands (4 and 5) and through-hole lands (6 and 7) on the top and bottom faces (2a and 2b) of the substrate (2), a through-hole (8) is bored between the through-hole lands (6 and 7) by a process of boring (for example, punching) through-holes in the printed circuit board (3). After forming the through-holes, conductive paste is packed (using for example, the silk-screen printing method). Thus, conductive paste (9) (for example, copper or, silver paste) is packed into the through-hole (8), thereby forming the resistance measurement lands (10 and 11).

As described above, the test land (1), provided in the processes of forming circuit patterns and through-holes, consists of the current measurement lands (4 and 5) and the resistance measurement lands (10 and 11) in the printed circuit board (3).

Therefore, according to the present invention, during the manufacture of a printed circuit board having through-holes filled with conductive paste, a test land of the printed circuit board can be used to confirm the electrical condition of the through-holes. In particular, in accordance with the present invention current measurement lands and resistance measurement lands composing the test land can measure mΩ resistivity using the four-probe method, thereby improving the accuracy with which circuit boards are inspected.

Second Embodiment

FIG. 3 is a top plan view showing a test land of a printed circuit board with through-holes as the second embodiment of the present invention. FIG. 4 is a longitudinal sectional view showing the test land. FIG. 5 is a bottom plan view showing the test land.

In the second embodiment, as in the first embodiment, the test land (1) is provided in the process of providing pattern circuits and through-holes during the manufacture of the printed circuit board (3). The test land (1) consists of current measurement lands (4 and 5), resistance measurement lands (10, 11, 14, and 15), and a jumper circuit (16).

The current measurement lands (4 and 5) are provided on the top face of a substrate (2), and through-holes (12 and 13) are provided in the substrate (2). The resistance measurement lands (10 and 11) are provided on the outer periphery of the through-holes (12 and 13), respectively, on the top face of the substrate (2), and the resistance measurement lands (14 and 15) are provided in positions corresponding to the resistance measurement lands (10 and 11), respectively, on the bottom face of the substrate (2) and are connected together by the jumper circuit (16).

It is clear from the above description that the current measurement lands (4 and 5) and the resistance measurement lands (10 and 11) of the test land (1) can be used to measure current and voltage.

Therefore, in the second embodiment, in the same manner as in the first embodiment, during the manufacture of a printed circuit board with through-holes, a test land of the printed circuit board can be used to confirm the electrical condition of the through-holes, thereby improving the accuracy with which the circuit boards are inspected.

I claim:

1. A printed circuit board having through-holes, comprising: a test land for testing said through-holes, said test land comprising a pair of current measurement lands and a pair of resistance measurement lands, and said through-holes being filled with conductive paste between the two sides of said printed circuit board, wherein the test land is disposed in a predefined area of the printed circuit board which encompasses said through-holes.

2. A printed circuit board having through-holes filled with conductive paste between the two opposed sides of the printed circuit board, comprising: a test land disposed in a predefined area of the printed circuit board and having a pair of resistance measurement lands on opposed sides of the printed circuit board and a pair of current measurement lands on one side or on both sides of the printed circuit board in the predefined area, and at least one measurement through-hole extending through the printed circuit board and through the opposed resistance measurement lands in the predefined area, wherein the at least one measurement through-hole is filled with conductive paste during manufacture of the printed circuit board.

3. A printed circuit board according to claim 2, wherein the test land is removable from the printed circuit board.

4. A printed circuit board according to claim 2, wherein the test land comprises current measurement lands and resistance measurement lands on both sides of the printed circuit board.

5. A printed circuit board having through-holes filled with conductive paste between the two opposed sides of the printed circuit board, comprising: a test land disposed in a predefined area of the printed circuit board, the test land comprising two current measurement lands and two resistance measurement lands on one side of the printed circuit board, two resistance measurement lands on the other side of the printed circuit board, two measurement through-holes extending through the printed circuit board and through respective pairs of resistance measurement lands disposed on opposed sides of the printed circuit board, and a jumper on the other side of the printed circuit board connecting together the two resistance measurement lands disposed thereon, wherein each of the measurement through-holes is filled with conductive paste during manufacture of the printed circuit board. p

* * * * *